(12) United States Patent
Chong

(10) Patent No.: US 12,224,304 B2
(45) Date of Patent: Feb. 11, 2025

(54) LIGHT EMITTING DIODE STRUCTURE WITH INDIVIDUAL FUCTIONABLE LED UNITS AND METHOD FOR MANUFACTURING THE SAME

(71) Applicant: RAYSOLVE OPTOELECTRONICS (SUZHOU) COMPANY LIMITED, Suzhou (CN)

(72) Inventor: Wing Cheung Chong, Hong Kong (CN)

(73) Assignee: RAYSOLVE OPTOELECTRONICS (SUZHOU) COMPANY LIMITED, Suzhou (CN)

( * ) Notice: Subject to any disclaimer, the term of this patent is extended or adjusted under 35 U.S.C. 154(b) by 540 days.

(21) Appl. No.: 17/162,515

(22) Filed: Jan. 29, 2021

(65) Prior Publication Data
US 2021/0320145 A1    Oct. 14, 2021

Related U.S. Application Data

(60) Provisional application No. 63/007,829, filed on Apr. 9, 2020.

(51) Int. Cl.
*H01L 27/15* (2006.01)
*H01L 33/00* (2010.01)
(Continued)

(52) U.S. Cl.
CPC ........ *H01L 27/156* (2013.01); *H01L 33/0093* (2020.05); *H01L 33/06* (2013.01);
(Continued)

(58) Field of Classification Search
CPC . H01L 33/06; H01L 33/44; H01L 2933/0016; H01L 2933/0025;
(Continued)

(56) References Cited

U.S. PATENT DOCUMENTS 8,415,700 B2 *   4/2013   Jeong ................... H01L 33/387
                                                           257/E33.072
10,177,127 B2    1/2019   Zhang et al.
(Continued)

FOREIGN PATENT DOCUMENTS

CN      101872813 A       10/2010
CN      202332853 U    *   7/2012
(Continued)

OTHER PUBLICATIONS

English translation CN-202332853 (Year: 2012).*
(Continued)

*Primary Examiner* — Shaun M Campbell
*Assistant Examiner* — David Paul Sedorook
(74) *Attorney, Agent, or Firm* — Westbridge IP LLC

(57) ABSTRACT

The LED structure includes a substrate and a plurality of LED units formed on the substrate. Each LED unit includes a bonding layer formed on the substrate, a first doping type semiconductor layer formed on the bonding layer, a second doping type semiconductor layer formed on the first doping type semiconductor layer, a passivation layer formed on the second doping type semiconductor layer and a portion of the first doping type semiconductor layer; and an electrode layer formed on a portion of the passivation layer and contacting the second doping type semiconductor layer. The plurality of LED units include a first LED unit and a second LED unit adjacent to the first LED unit. The first doping type semiconductor layer of the first LED unit horizontally extends to the first doping type semiconductor layer of the second LED unit adjacent to the first LED unit, and the first LED unit and the second LED unit are individually functionable LED units.

15 Claims, 12 Drawing Sheets

(51) Int. Cl.
   *H01L 33/06* (2010.01)
   *H01L 33/38* (2010.01)
   *H01L 33/44* (2010.01)
   *H01L 33/62* (2010.01)

(52) U.S. Cl.
   CPC .............. *H01L 33/38* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
   CPC ... H01L 33/385; H01L 25/0753; H01L 33/38; H01L 27/156; H01L 33/62; H01L 2933/0066
   See application file for complete search history.

(56) References Cited

U.S. PATENT DOCUMENTS

| | | | |
|---|---|---|---|
| 2007/0075330 A1* | 4/2007 | Ogihara | B41J 2/45 257/E27.12 |
| 2008/0113462 A1 | 5/2008 | Kim et al. | |
| 2014/0159064 A1* | 6/2014 | Sakariya | H01L 25/167 257/88 |
| 2015/0076528 A1* | 3/2015 | Chan | H01L 24/05 438/34 |
| 2016/0021773 A1* | 1/2016 | Yun | G02F 1/1368 361/752 |
| 2016/0072012 A1* | 3/2016 | Chen | H01L 33/44 257/101 |
| 2017/0194304 A1* | 7/2017 | Takeya et al. | H01L 25/16 |
| 2017/0331001 A1* | 11/2017 | Yu et al. | H01L 33/06 |
| 2017/0373228 A1 | 12/2017 | Chang et al. | |
| 2018/0190712 A1 | 7/2018 | Xu et al. | |
| 2018/0287027 A1 | 10/2018 | Chaji | |
| 2018/0331086 A1 | 11/2018 | Chang et al. | |
| 2018/0351036 A1* | 12/2018 | Chang et al. | H01L 33/06 |
| 2019/0115334 A1 | 4/2019 | Zhang et al. | |
| 2019/0164947 A1 | 5/2019 | Yoo | |
| 2019/0229235 A1* | 7/2019 | Iguchi | H01L 33/24 |
| 2021/0272936 A1* | 9/2021 | Kim | H01L 25/0753 |
| 2023/0018566 A1* | 1/2023 | Son | H01L 25/167 |

FOREIGN PATENT DOCUMENTS

| | | |
|---|---|---|
| CN | 108598104 A | 9/2018 |
| CN | 109216397 A | 1/2019 |
| CN | 109417082 A | 3/2019 |
| CN | 109713089 A | 5/2019 |
| CN | 109920814 A | 6/2019 |
| JP | 201832804 A | 3/2018 |
| JP | 201950355 A | 3/2019 |
| KR | 20160137182 A | 11/2016 |
| KR | 20170143336 A | 12/2017 |

OTHER PUBLICATIONS

International Search Report from corresponding PCT Application No. PCT/CN2021/083179 dated Jun. 29, 2021 (3 pages).
Office Action in related Chinese Application No. 202110317555.9 dated May 17, 2022 (10 pages).
Office Action in related Chinese Application No. 202110317555.9 dated Jul. 14, 2022 (9 pages).
Office Action in related Japanese Application No. 2022-555664 dated Jul. 11, 2023 (5 pages).
European Search Report issued in counterpart European Patent Application No. EP 21784647.6, dated Apr. 8, 2024.
Request for the Submission of an Opinion issued in counterpart Korean Patent Application No. KR 10-2022-7031981, dated Jun. 20, 2024.

* cited by examiner

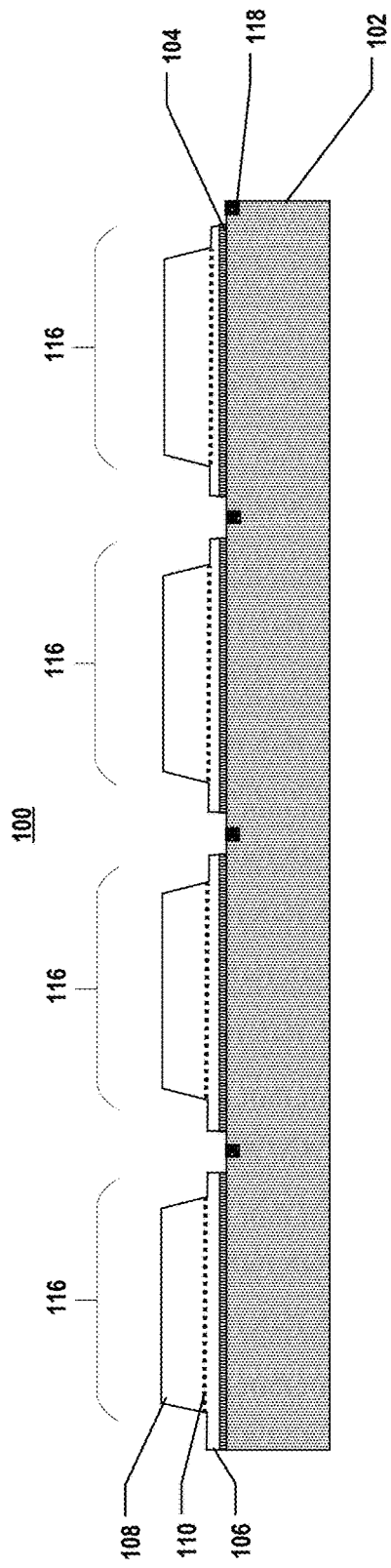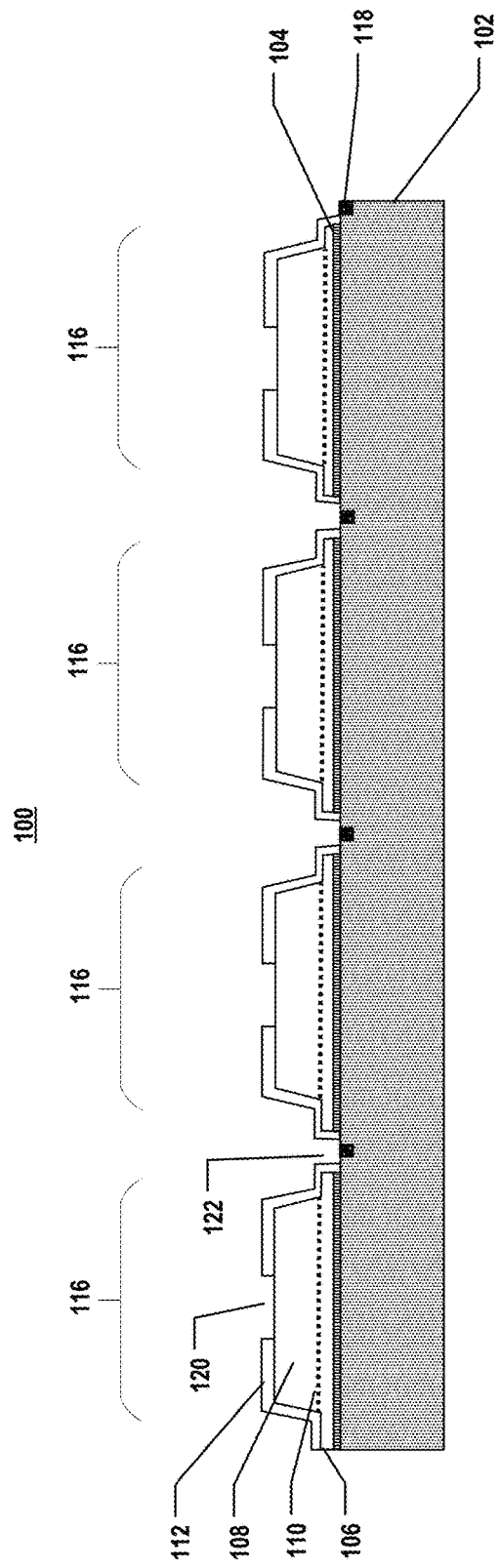

LIGHT EMITTING DIODE STRUCTURE WITH INDIVIDUAL FUCTIONABLE LED UNITS AND METHOD FOR MANUFACTURING THE SAME

CROSS-REFERENCE TO RELATED APPLICATION

This application claims the benefit of priority of U.S. Provisional Application No. 63/007,829, filed on Apr. 9, 2020, entitled "Semiconductor Array and Method of Monolithic Integration," the content of which is incorporated herein by reference in its entirety.

TECHNICAL FIELD

The present disclosure relates to a light emitting diode (LED) structure and a method for manufacturing the LED structure, and more particularly, to a LED structure with a plurality of individually functionable LED units while sharing a doping layer and the method for manufacturing the same.

BACKGROUND

In the recent years, LEDs have become popular in lighting applications. As light sources, LEDs have many advantages including higher light efficiency, lower energy consumption, longer lifetime, smaller size, and faster switching.

Displays having micro-scale LEDs are known as micro-LED. Micro-LED displays have arrays of micro-LEDs forming the individual pixel elements. A pixel may be a minute area of illumination on a display screen, one of many from which an image is composed. In other words, pixels may be small discrete elements that together constitute an image as on a display. Pixels are normally arranged in a two-dimensional (2D) matrix, and are represented using dots, squares, rectangles, or other shapes. Pixels may be the basic building blocks of a display or digital image and with geometric coordinates.

When manufacturing the micro-LEDs, an etching process, such as a dry etching or a wet etching process, is frequently used to electrically isolate individual micro-LEDs. In order to yield a plurality of fully isolated functional micro-LED mesas, the conventional process typically etches away the continuous functional epitaxy layer completely. However, when transferring, or after transferring, the conventional micro-LED mesas to a substrate, such as a driving circuit substrate, the fully isolated functional micro-LED mesas may easily peel off from the substrate because the adhesion of the micro-LED mesas is weak. The problem is even more significant when the micro-LED mesas become even smaller. Furthermore, during the convention etching process to isolate the micro-LED mesas, the sidewalls of the micro-LED mesas may be damaged and impact the optical and electrical properties of the LED structure.

Embodiments of the disclosure address the above problems by providing a LED structure with a plurality of individually functionable LED units while sharing a doping layer or a bonding layer and the method for manufacturing the same.

SUMMARY

Embodiments of the LED structure and method for forming the LED structure are disclosed herein.

In one example, a LED structure is disclosed. The LED structure includes a substrate and a plurality of LED units formed on the substrate. Each LED unit includes a bonding layer formed on the substrate, a first doping type semiconductor layer formed on the bonding layer, a second doping type semiconductor layer formed on the first doping type semiconductor layer, a passivation layer formed on the second doping type semiconductor layer and a portion of the first doping type semiconductor layer, and an electrode layer formed on a portion of the passivation layer and contacting the second doping type semiconductor layer. The plurality of LED units include a first LED unit and a second LED unit adjacent to the first LED unit. The first doping type semiconductor layer of the first LED unit horizontally extends and physically connect to the first doping type semiconductor layer of the second LED unit adjacent to the first LED unit, and the first LED unit and the second LED unit are individually functionable LED units.

In another example, a LED structure is disclosed. The LED structure includes a substrate and a plurality of LED units formed on the substrate. Each LED unit includes a p-n diode layer formed on the substrate, a passivation layer formed on the p-n diode layer, and an electrode layer formed on the passivation layer and contacting the p-n diode layer. The plurality of LED units include a first LED unit and a second LED unit adjacent to the first LED unit. The first LED unit and the second LED unit have a common anode, and the first LED unit and the second LED unit are individually functionable LED units.

In a further example, a method for manufacturing a LED structure is disclosed. A semiconductor layer is formed on a first substrate. The semiconductor layer includes a first doping type semiconductor layer and a second doping type semiconductor layer. A first etching operation is performed to remove a portion of the second doping type semiconductor layer and expose a portion of the first doping type semiconductor layer. A second etching operation is performed to remove a portion of the first doping type semiconductor layer and expose a portion of the first substrate with contact of pixel circuit. A passivation layer is formed on the second doping type semiconductor layer and the exposed first doping type semiconductor layer. A third etching operation is performed to form a first opening on the passivation layer on the second doping type semiconductor layer, and second opening on the passivation layer on the first substrate with contact of pixel circuit. An electrode layer is formed on the passivation layer covering the first opening and contacting the second doping type semiconductor layer, the second opening and contacting the first substrate with contact of pixel circuit.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIGS. 6A-6H illustrate cross sections of an exemplary LED structure at different stages of a manufacturing process, according to some implementations of the present disclosure.

Figure 1:
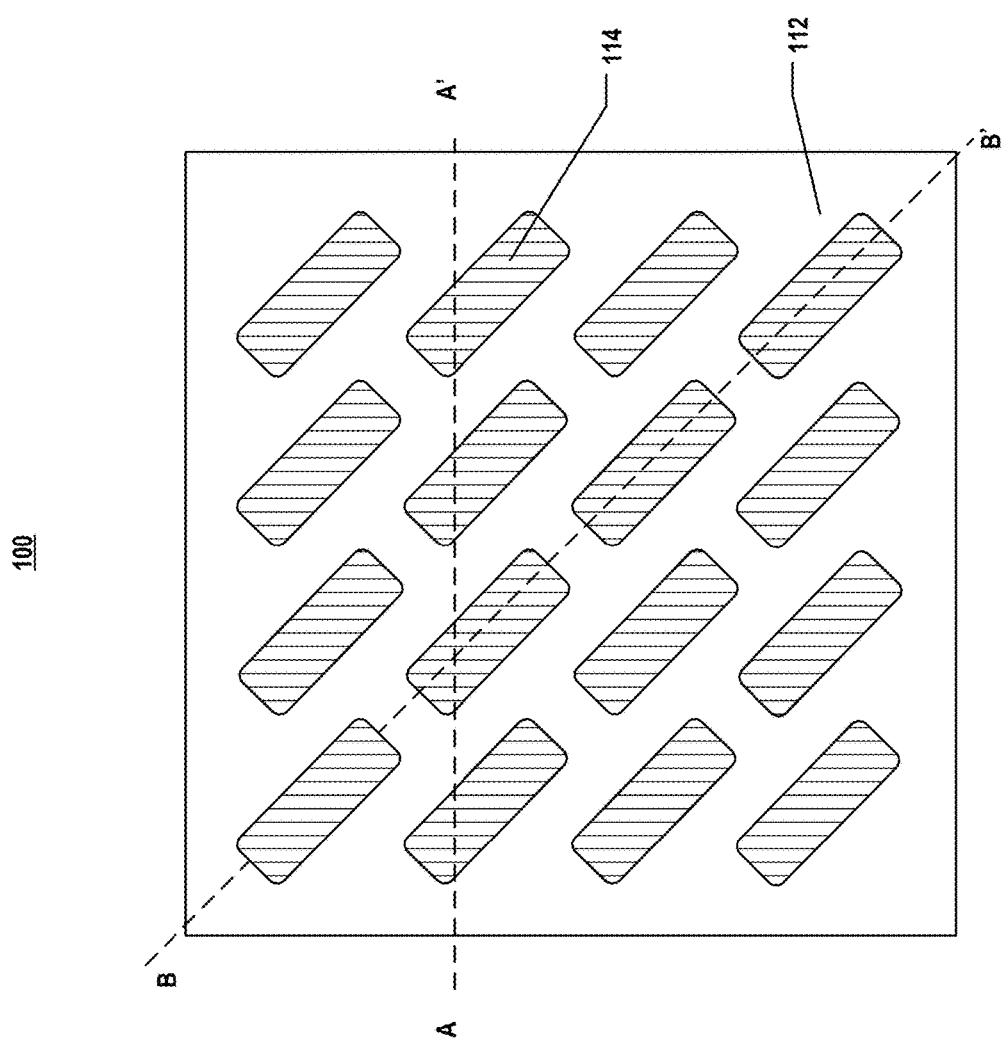
FIG. 1 illustrates a top view of an exemplary LED structure, according to some implementations of the present disclosure.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, a semiconductor layer can include one or more doped or undoped semiconductor layers and may have the same or different materials.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, silicon carbide, gallium nitride, germanium, gallium arsenide, indium phosphide, etc. Alternatively, the substrate can be made from an electrically non-conductive material, such as a glass, a plastic, or a sapphire wafer. Further alternatively, the substrate can have semiconductor devices or circuits formed therein.

As used herein, the term "micro" LED, "micro" p-n diode or "micro" device refers to the descriptive size of certain devices or structures according to implementations of the invention. As used herein, the terms "micro" devices or structures are meant to refer to the scale of 0.1 to 100 μm. However, it is to be appreciated that implementations of the present invention are not necessarily so limited, and that certain aspects of the implementations may be applicable to larger, and possibly smaller size scales.

Implementations of the present invention describe LED structure or micro LED structure and a method for manufacturing the structure. For manufacturing a micro-LED display, an epitaxy layer is bonded to a receiving substrate. The receiving substrate, for example, may be, but is not limited to, a display substrate including CMOS backplane or TFT glass substrate. Then the epitaxy layer is formed with an array of micro LEDs on the receiving substrate. When forming the micro LEDs on the receiving substrate, because the adhesion of the small functional mesas on the receiving substrate is weak and it is proportional to the mesa size, the plurality of small functional mesas may peel off from the receiving substrate and cause failure of a display (dead pixel) during the manufacturing process. To address the aforementioned issues, the present disclosure introduces a solution in which the functional epitaxy layer is partially patterned/etched and allows a thin continuous functional layer and a bonding layer to remain to avoid potential peeling off. In addition, the manufacturing method described in the present disclosure can further reduce physical damage of sidewalls of functional mesas, reduce damage of quantum well structure which is the light emitting region of the LED, and improve the optical and electrical properties of functional mesas.

Figure 2:
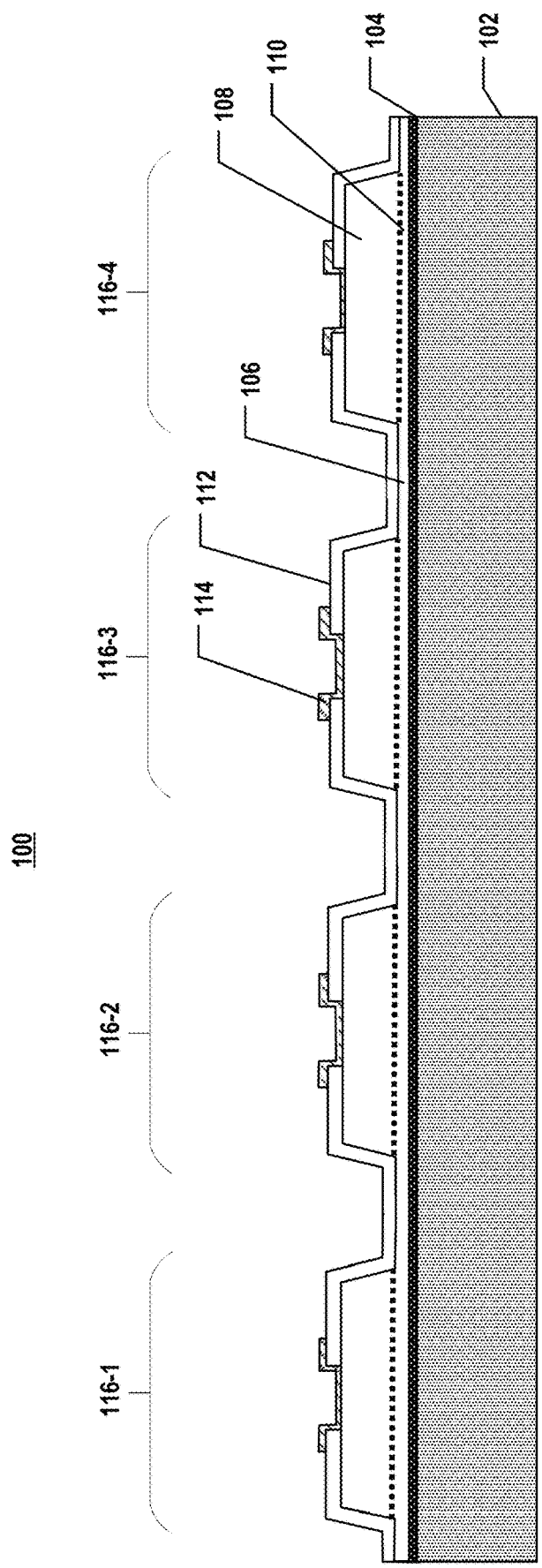
FIG. 2 illustrates a cross-section view of an exemplary LED structure, according to some implementations of the present disclosure.

FIG. 1 illustrates a top view of an exemplary LED structure 100, according to some implementations of the present disclosure, and FIG. 2 illustrates a cross-section view of an exemplary LED structure 100 along line A-A', according to some implementations of the present disclosure. For the purpose of better explaining the present disclosure, the tope view of LED structure 100 in FIG. 1 and the cross-section view of LED structure 100 in FIG. 2 will be described together. LED structure 100 includes a first substrate 102 and a plurality of LED units 116 (e.g., LED units 116-1, 116-2, 116-3, and 116-4 as shown in FIG. 2). LED units 116 are bonded on first substrate 102 through a bonding layer 104. In some implementations, first substrate 102 may include a semiconductor material, such as silicon, silicon carbide, gallium nitride, germanium, gallium arsenide, indium phosphide. In some implementations, first substrate 102 may be made from an electrically non-conductive material, such as a glass, a plastic or a sapphire wafer. In some implementations, first substrate 102 may have driving circuits formed therein, and first substrate 102 may be CMOS backplane or TFT glass substrate. The driving circuit provides the electronic signals to LED units 116 to control the luminance. In some implementations, the driving circuit may include an active matrix driving circuit, in which each individual LED unit 116 corresponds to an independent driver. In some implementations, the driving circuit may include a passive matrix driving circuit, in which the plurality of LED units 116 are aligned in an array and are connected to the data lines and the scan lines driven by the driving circuit.

Bonding layer 104 is a layer of an adhesive material formed on first substrate 102 to bond first substrate 102 and LED units 116. In some implementations, bonding layer 104 may include a conductive material, such as metal or metal alloy. In some implementations, bonding layer 104 may include Au, Sn In Cu or Ti. In some implementations, bonding layer 104 may include a non-conductive material, such as polyimide (PI), polydimethylsiloxane (PDMS). In some implementations, bonding layer 104 may include a photoresist, such as SIU-8 photoresist. In some implementations, bonding layer 104 may be hydrogen silsesquioxane (HSQ) or divinylsiloxane-bis-benzocyclobutene (DVS-BCB). It is understood that the descriptions of the material of bonding layer 104 are merely illustrative and are not limiting, and those skilled in the art can change according to requirements, all of which are within the scope of the present application.

Referring to FIG. 2, each LED unit 116 includes its portion of bonding layer 104, a first doping type semiconductor layer 106 and a second doping type semiconductor layer 108. First doping type semiconductor layer 106 is formed on bonding layer 104. In some implementations, first doping type semiconductor layer 106 and second doping type semiconductor layer 108 may include one or more layers based on II-VI materials, such as ZnSe or ZnO, or III-V nitride materials, such as GaN, AlN, InN, InGaN, GaP, AlInGaP, AlGaAs, and their alloys.

In some implementations, first doping type semiconductor layer 106 may be a p-type semiconductor layer that extends across multiple LED units 116 (e.g., four LED units 116 as illustrated in FIG. 2) and forms a common anode of these LED units 116. For example, first doping type semiconductor layer 106 of LED unit 116-2 extends to its adjacent LED units 116-1 and 116-3, and similarly, first doping type semiconductor layer 106 of LED unit 116-3 extends to its adjacent LED units 116-2 and 116-4. In some implementations, first doping type semiconductor layer 106 that extend across the LED units may be relatively thin. In some implementations, the thickness of first doping type semiconductor layer 106 may be between about 0.05 µm and about 1 µm. In some other implementations, the thickness of first doping type semiconductor layer 106 may be between about 0.05 µm and about 0.7 µm. In some alternative implementations, the thickness of first doping type semiconductor layer 106 may be between about 0.05 µm and about 0.5 µm. By having a thin layer of continuous first doping type semiconductor across the individual LED units, the bonding area between substrate 102 and the plurality of LED units 116 is not limited in the area beneath second doping type semiconductor layer 108 but also extended to the area between the individual LED units. In other words, by having a thin layer of continuous first doping type semiconductor 106, the area of bonding layer 104 is increased. Hence, the bonding strength between substrate 102 and the plurality of LED units 116 is strengthened and the risk of peeling-off of LED structure 100 can be reduced.

In some implementations, first doping type semiconductor layer 106 may be p-type GaN. In some implementations, first doping type semiconductor layer 106 may be formed by doping magnesium (Mg) in GaN. In some implementations, first doping type semiconductor layer 106 may be p-type InGaN. In some implementations, first doping type semiconductor layer 106 may be p-type AlInGaP. Each of LED units 116 has an anode and a cathode connected to the driving circuit, e.g., one that is formed in substrate 102 (driving circuit not explicitly shown). For example, each LED unit 116 has the anode connected to a constant voltage source and has the cathode connected to a source/drain electrode of the driving circuit. In other words, by forming the continuous first doping type semiconductor 106 across the individual LED units 116, the plurality of LED units 116 have a common anode formed by first doping type semiconductor layer 106 and bonding layer 104.

In some implementations, second doping type semiconductor layer 108 may be a n-type semiconductor layer and form a cathode of each LED unit 116. In some implementations, second doping type semiconductor layer 108 may be n-type GaN. In some implementations, second doping type semiconductor layer 108 may be n-type InGaN. In some implementations, second doping type semiconductor layer 108 may be n-type AlInGaP. Second doping type semiconductor layers 108 of different LED units 116 are electrically isolated, thus each LED unit 116 has a cathode that can have a voltage level different from the other units. As a result of the disclosed implementations, a plurality of individually functionable LED units 116 are formed with their first doping type semiconductor layers 106 horizontally extended across the adjacent LED units, and their second doping type semiconductor layers 108 electrically isolated between the adjacent LED units.

Each LED unit 116 further includes a multiple quantum well (MQW) layer 110 formed between first doping type semiconductor layer 106 and second doping type semiconductor layer 108. MQW layer 110 is the active region of LED unit 116. In some implementations, the thickness including first doping type semiconductor layer 106, MQW layer 110 and second doping type semiconductor layer 108 may be between about 0.3 µm and about 5 µm. In some other implementations, the thickness including first doping type semiconductor layer 106, MQW layer 110 and second doping type semiconductor layer 108 may be between about 0.4 µm and about 4 µm. In some alternative implementations, the thickness including first doping type semiconductor layer 106, MQW layer 110 and second doping type semiconductor layer 108 may be between about 0.5 µm and about 3 µm.

As shown in FIG. 2, a passivation layer 112 is formed on second doping type semiconductor layer 108 and a portion of first doping type semiconductor layer 106. Passivation layer 112 may be used for protecting and isolating LED units

116. In some implementations, passivation layer 112 may include SiO$_2$, Al$_2$O$_3$, SiN or other suitable materials. In some implementations, passivation layer 112 may include polyimide, SU-8 photoresist, or other photo-patternable polymer. An electrode layer 114 is formed on a portion of passivation layer 112, and electrode layer 114 electrically connects second doping type semiconductor layer 108 through an opening on passivation layer 112. In some implementations, electrode layer 114 may be conductive materials, such as indium tin oxide (ITO), Cr, Ti, Pt, Au, Al, Cu, Ge or Ni.

Figure 3:
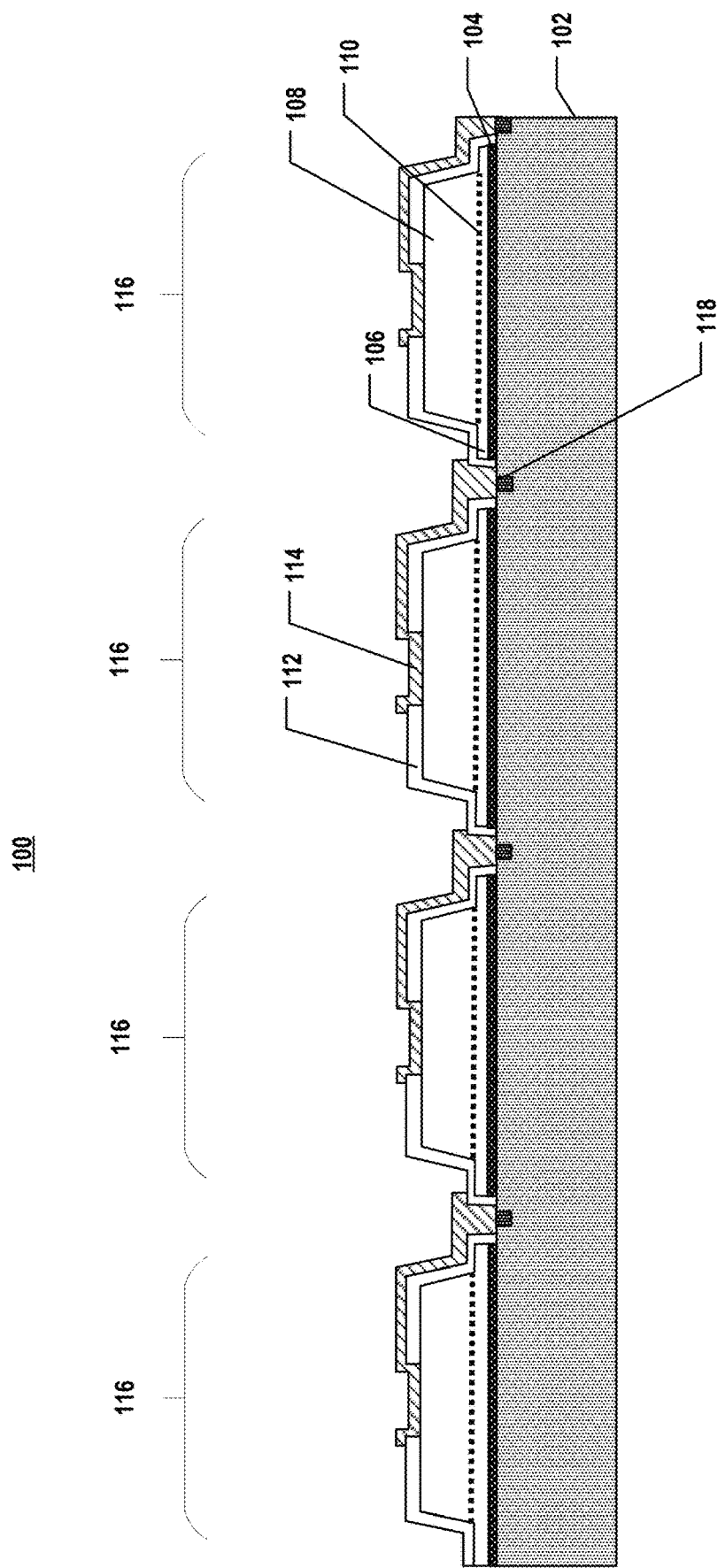
FIG. 3 illustrates another cross-section view of an exemplary LED structure, according to some implementations of the present disclosure.

FIG. 3 illustrates another cross-section view of the exemplary LED structure 100 along line B-B', according to some implementations of the present disclosure. First substrate 102 has driving circuits formed therein for driving LED units 116. A contact 118 of the driving circuit is exposed between two LED units 116, and contact 118 is electrically connected with second doping type semiconductor layer 108 through electrode layer 114. In other words, the electrical connection of second doping type semiconductor layer 108 and contact 118 of the driving circuit is accomplished by electrode layer 114. As described above, second doping type semiconductor layer 108 forms the cathode of each LED unit 116, hence contact 118 provides a driving voltage of the cathode of each LED unit 116 from the driving circuit to second doping type semiconductor layer 108 through electrode layer 114.

Figure 4:
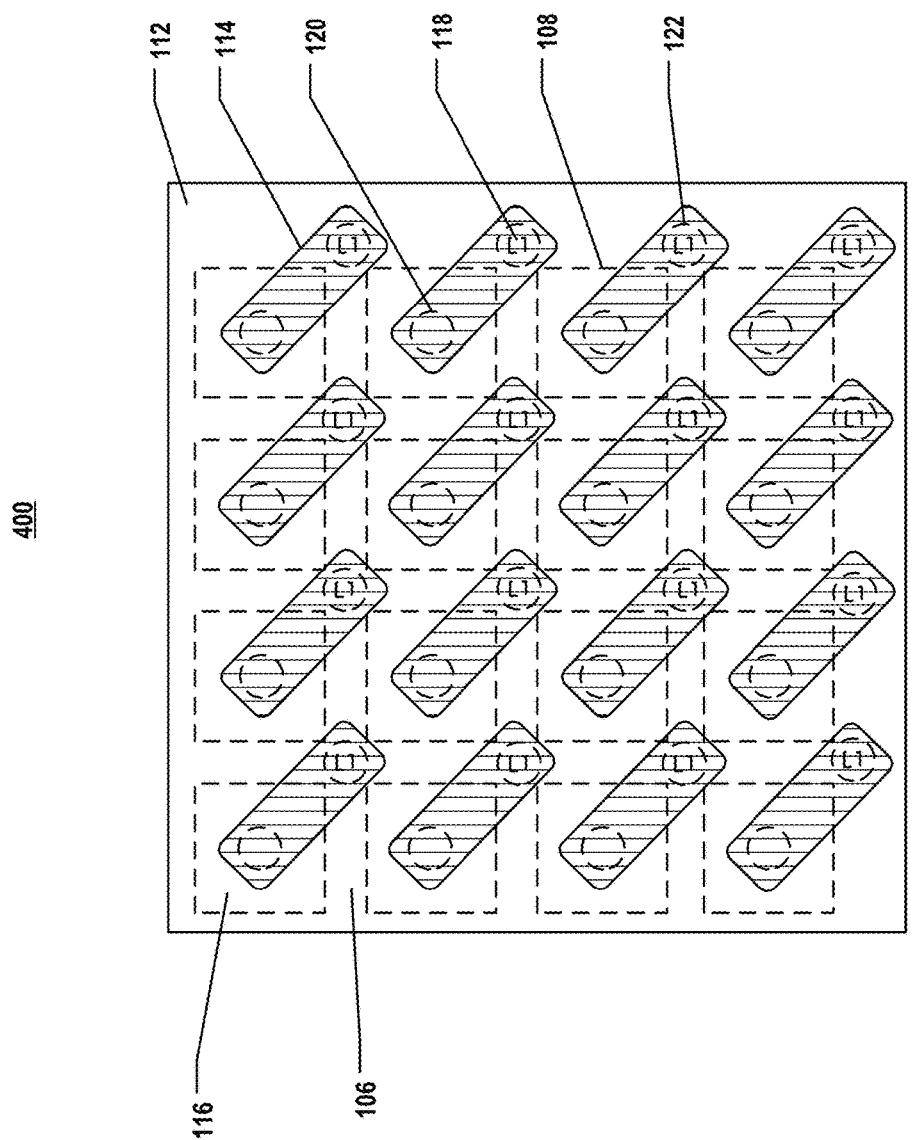
FIG. 4 illustrates another top view of an exemplary LED structure, according to some implementations of the present disclosure.

FIG. 4 illustrates another top view of LED structure 100, according to some implementations of the present disclosure. In FIG. 4, the layers beneath electrode layer 114 and passivation layer 112 are illustrated with dash lines for the purpose of explanation. In FIG. 4, LED structure 100 includes 16 LED units 116. Each LED unit 116 includes a p-n diode layer formed by first doping type semiconductor layer 106 and second doping type semiconductor layer 108 and multiple quantum well 110. Passivation layer 112 is formed on the p-n diode layer, and electrode layer 114 is formed on passivation layer 112.

An opening 120 is formed on passivation layer 112 exposing second doping type semiconductor layer 108, and an opening 122 is formed on passivation layer 112 exposing contact 118. Electrode layer 114 is formed on a portion of passivation layer 112 covering opening 120 and opening 122, and therefore electrode layer 114 electrically connects with second doping type semiconductor layer 108 and contact 118. In the exemplary shown in FIG. 4, opening 120 is located at the center of each LED unit 116 and opening 122 is located at the interspace of adjacent LED units 116. It is understood that the locations and designs (such as shapes and sizes) of opening 120, opening 122 and electrode layer 114 may deviate from the examples shown in FIG. 4 based on the requirements and are not limited here.

In FIG. 4. LED structure 100 includes 16 LED units 116, and each LED unit 116 is individually functionable. First doping type semiconductor layer 106 locates under second doping type semiconductor layer 108 and passivation layer 112, and first doping type semiconductor layer 106 is the common anode of these 16 LED units 116. Consistent with the present disclosure, a plurality of LED units are referred to as "individually functionable" when first doping type semiconductor layer 106 of these LED units (e.g., the 16 LED units 116) is electrically connected not only during the manufacturing process of forming LED structure 100 but also after the manufacturing process and each LED unit 116 can be individually driven by a different driving circuit.

Figure 5:
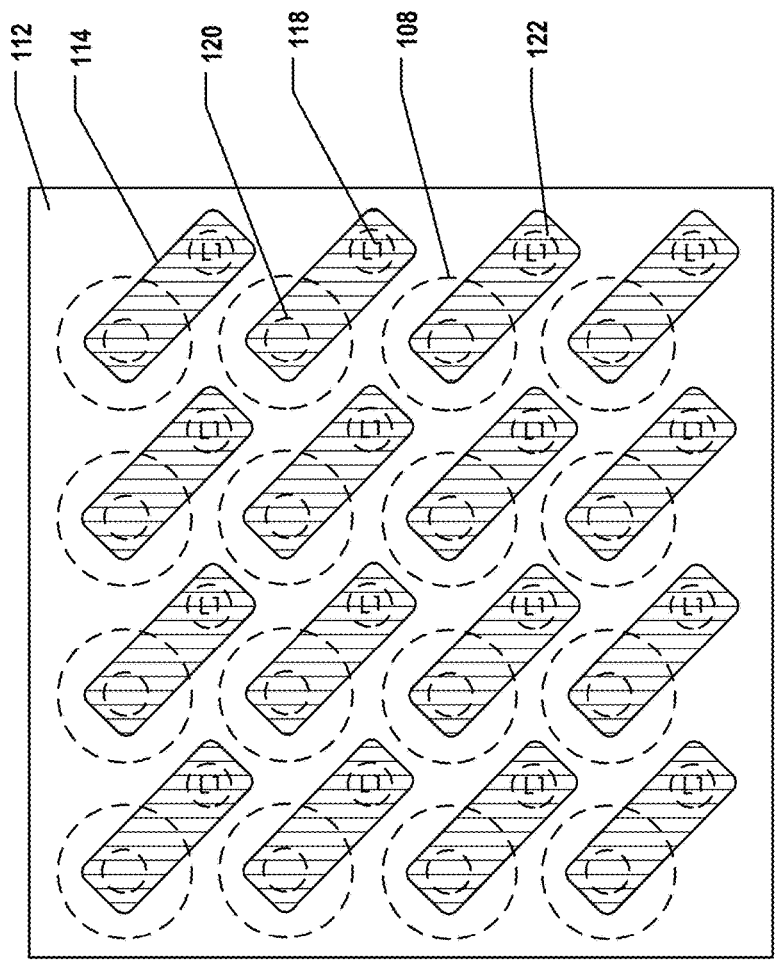
FIG. 5 illustrates a top view of another exemplary LED structure, according to some implementations of the present disclosure.

FIG. 5 illustrates a top view of another LED structure 500, according to some implementations of the present disclosure. The shape of second doping type semiconductor layer 108 in the top view in FIG. 5 is circular, which is different from the shape of second doping type semiconductor layer 108 in the top view of LED structure 100 shown in FIG. 4. It is understood that, in some implementations, the position and shape of second doping type semiconductor layer 108 in the top view may be changed according to various designs or applications, and the shape of second doping type semiconductor layer 108 or LED unit 116 in the top view is not limited here. In some implementations, the position and shape of opening 120, opening 122, electrode layer 114 or contact 118 in the top view may be changed according to various designs and applications as well, and is not limited here.

Figure 6A:
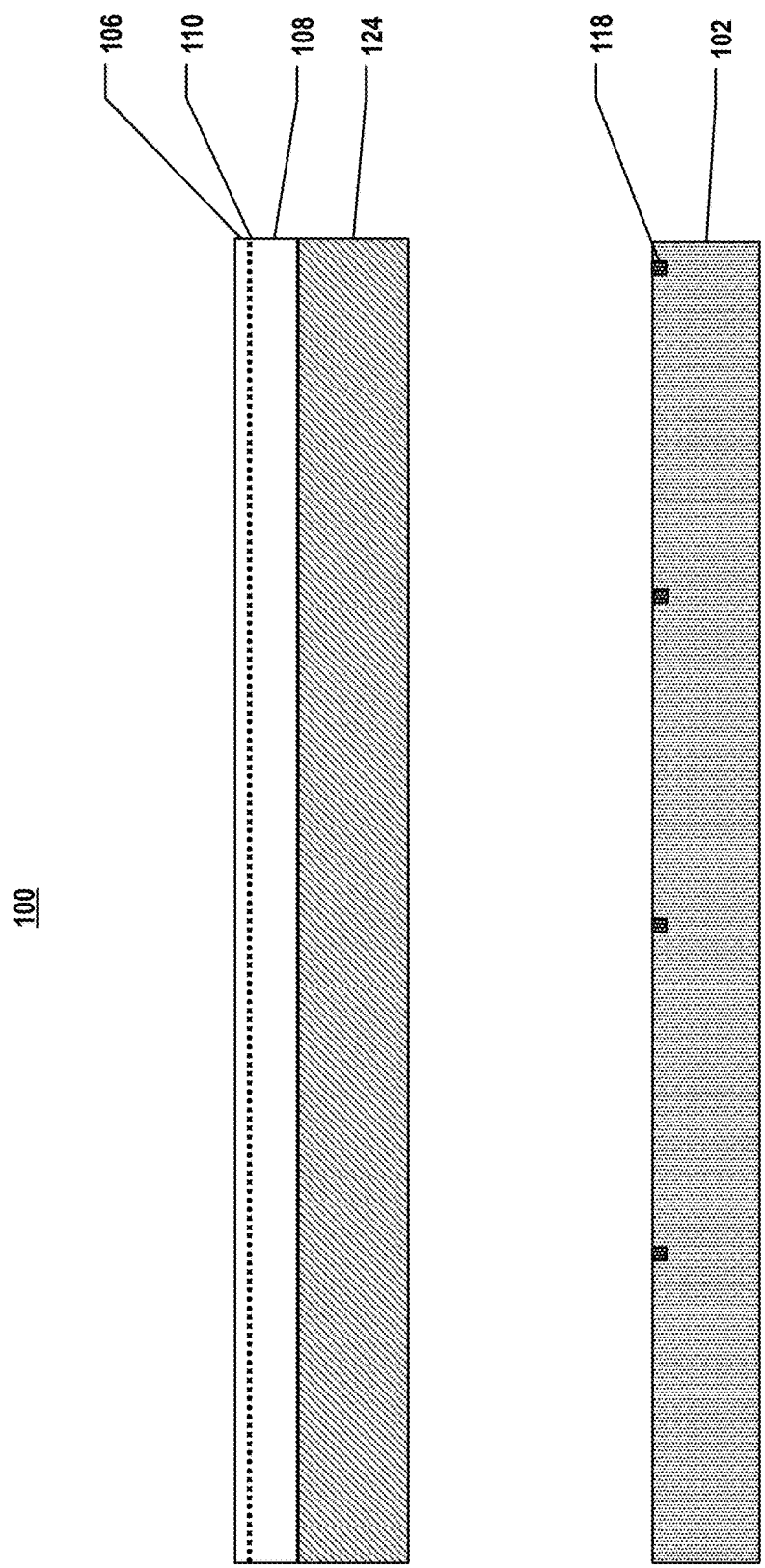
Figure 6B:
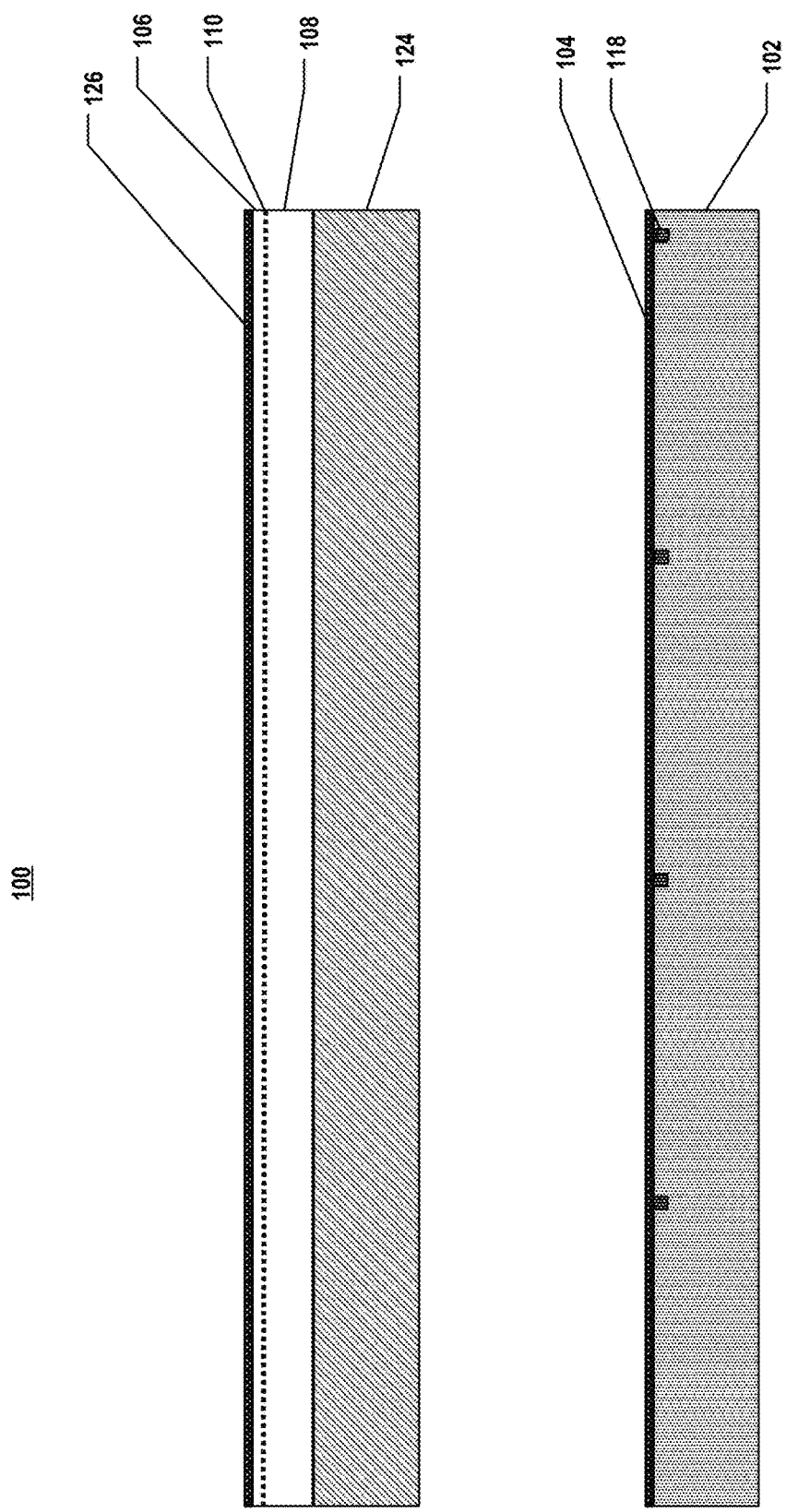
Figure 6C:
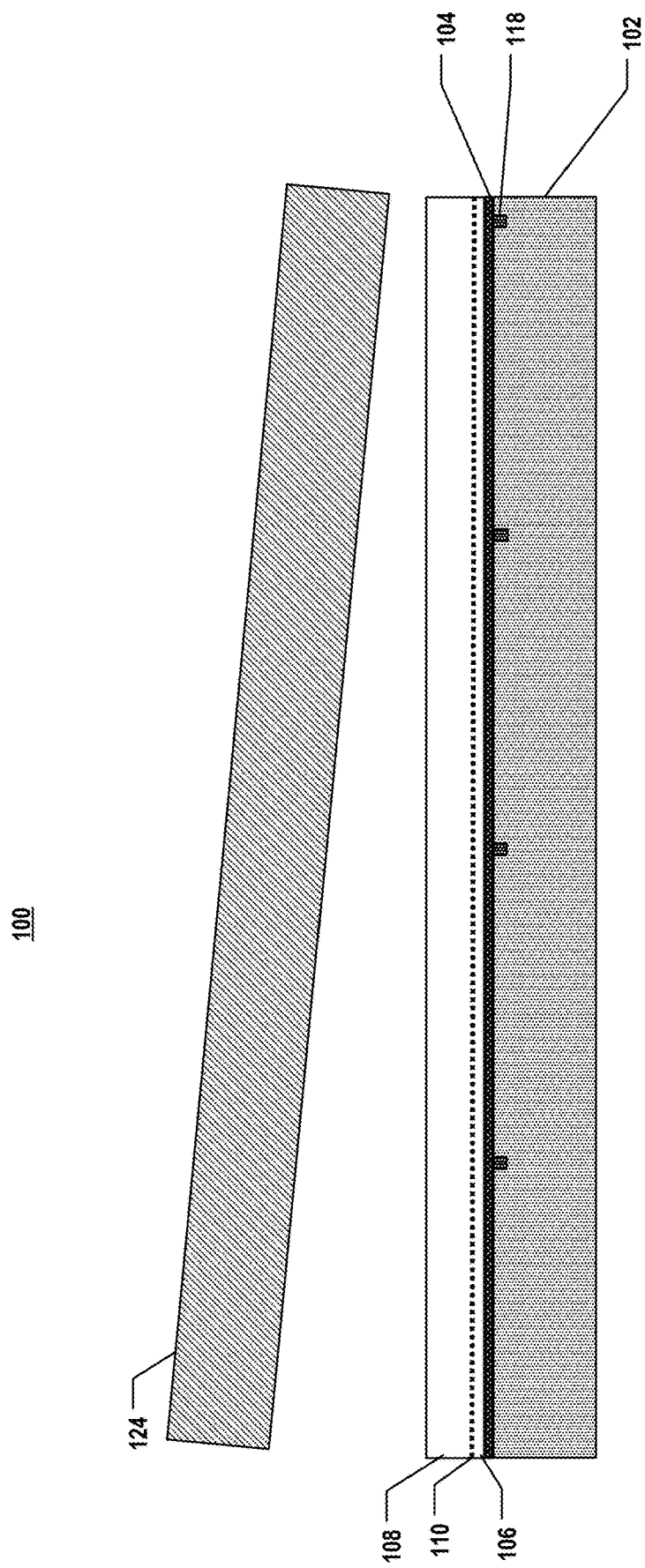
Figure 6D:
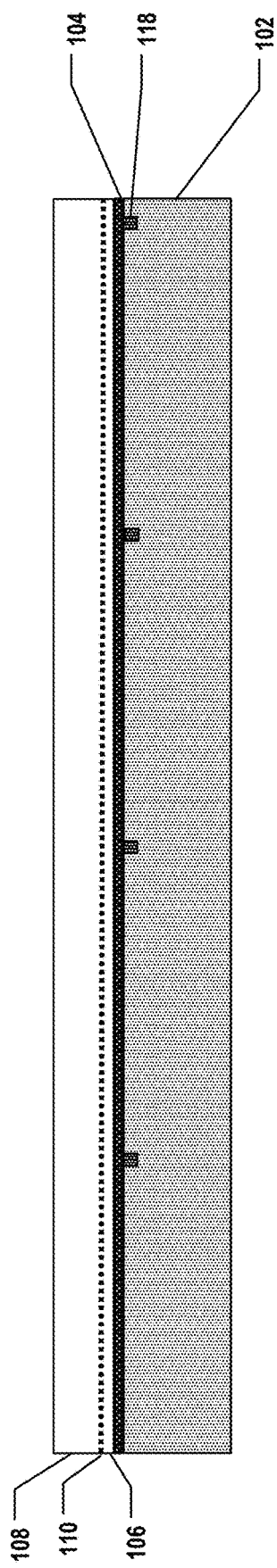
Figure 6E:
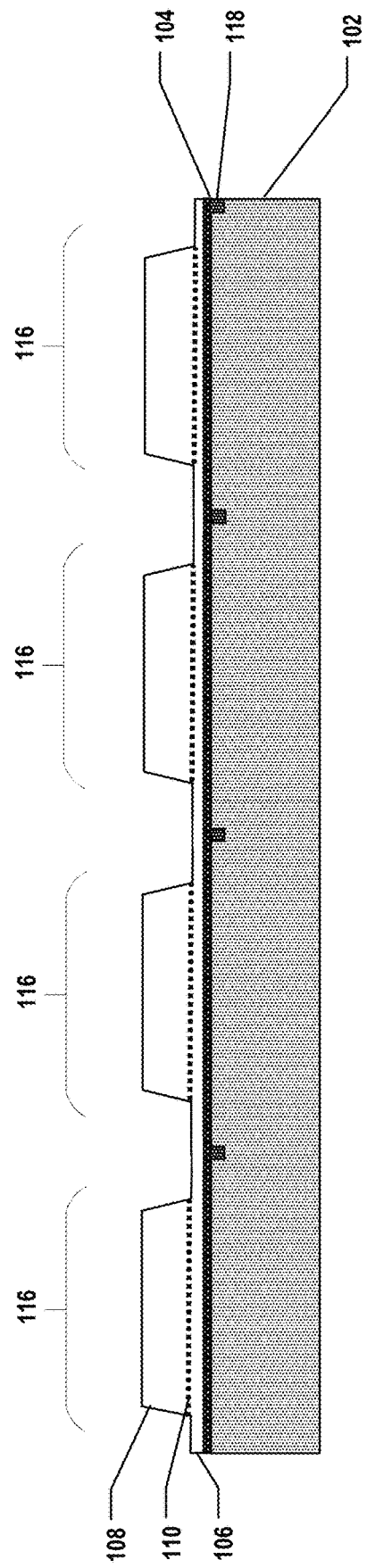
Figure 6H:
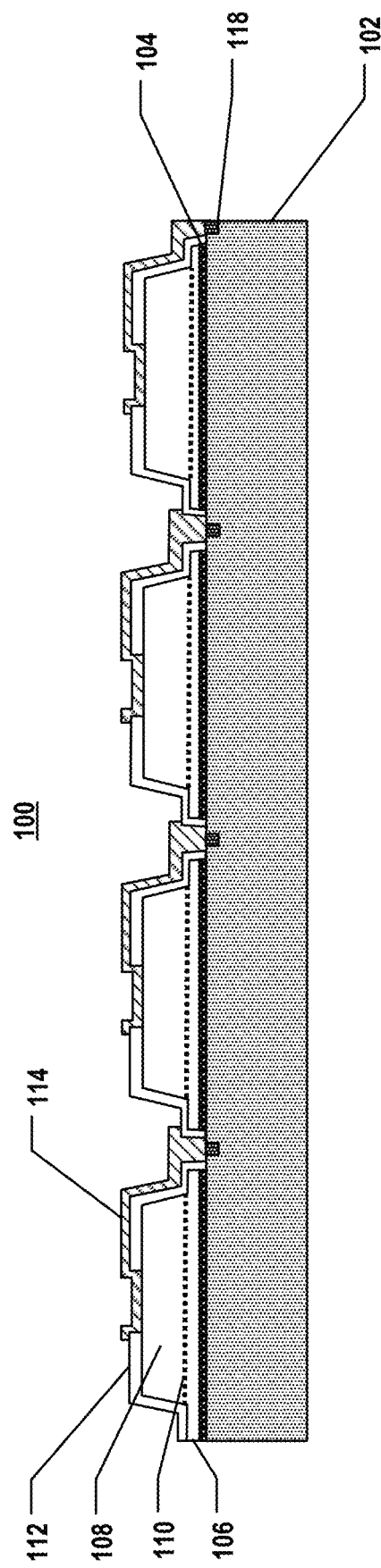
Figure 7:
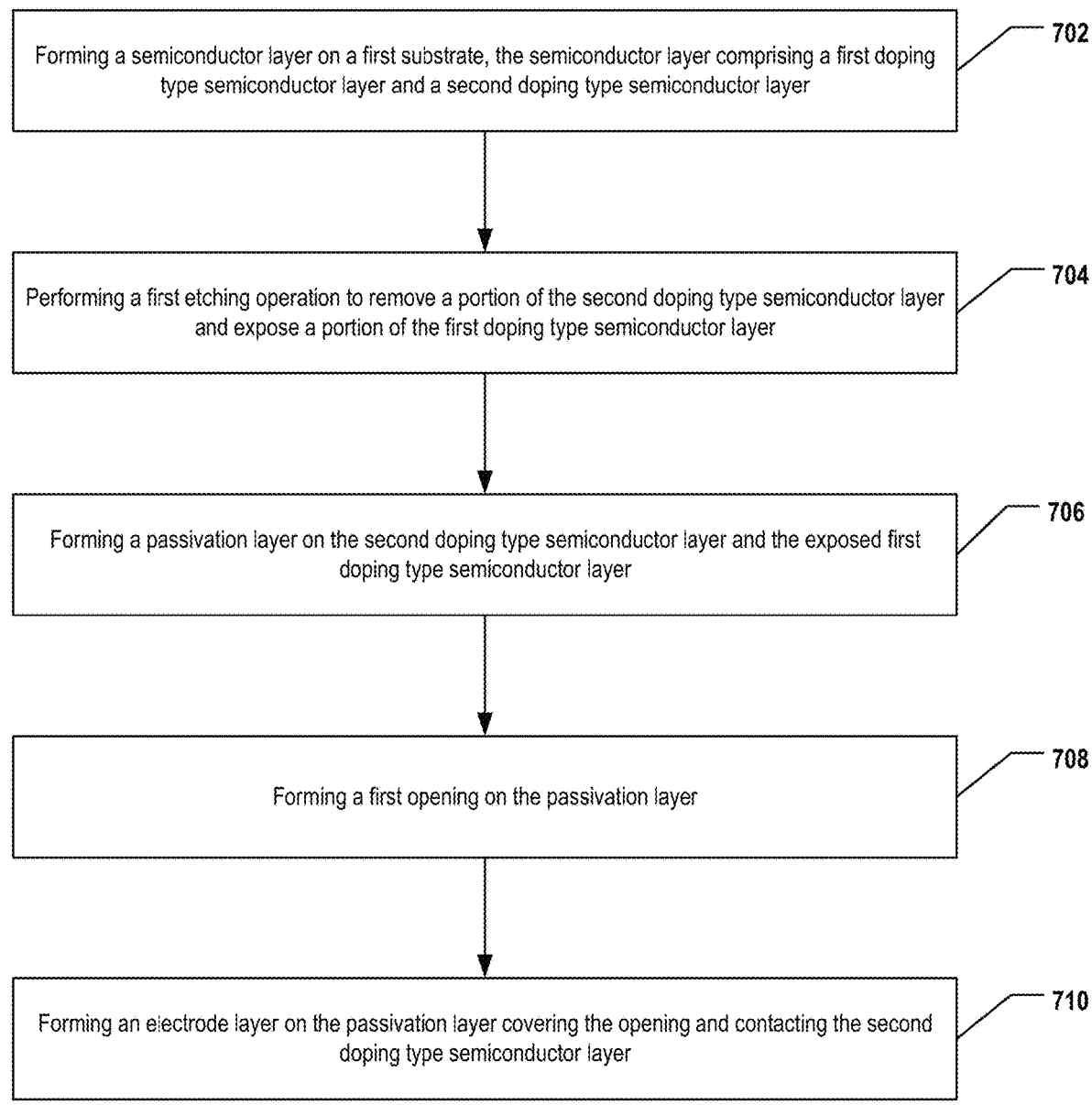
FIG. 7 is a flowchart of an exemplary method for manufacturing a LED structure, according to some implementations of the present disclosure.

FIGS. 6A-6H illustrate cross sections of the exemplary LED structure 100 during a manufacturing process, according to some implementations of the present disclosure, and FIG. 7 is a flowchart of an exemplary method 700 for manufacturing LED structure 100, according to some implementations of the present disclosure. For the purpose of better explaining the present disclosure, FIGS. 6A-6I and the flowchart in FIG. 7 will be described together. In FIG. 6A, a driving circuit is formed in first substrate 102 and the driving circuit includes contact 118. For example, the driving circuit may include CMOS devices manufactured on a silicon wafer and some wafer-level packaging layers or fan-out structures are stacked on the CMOS devices to form contact 118. For another example, the driving circuit may include TFTs manufactured on a glass substrate and some wafer-level packaging layers or fan-out structures are stacked on the TFTs to form contact 118. A semiconductor layer is formed on a second substrate 124, and the semiconductor layer includes first doping type semiconductor layer 106, second doping type semiconductor layer 108 and MQW layer 110.

In some implementations, first substrate 102 or second substrate 124 may include a semiconductor material, such as silicon, silicon carbide, gallium nitride, germanium, gallium arsenide, indium phosphide. In some implementations, first substrate 102 or second substrate 124 may be made from an electrically non-conductive material, such as a glass, a plastic or a sapphire wafer. In some implementations, first substrate 102 may have driving circuits formed therein, and first substrate 102 may include CMOS backplane or TFT glass substrate. In some implementations, first doping type semiconductor layer 106 and second doping type semiconductor layer 108 may include one or more layers based on II-VI materials, such as ZnSe or ZnO, or III-V nitride materials, such as GaN, AlN, InN, InGaN, GaP, AlInGaP, AlGaAs, and their alloys. In some implementations, first doping type semiconductor layer 106 may include a p-type semiconductor layer, and second doping type semiconductor layer 108 may include a n-type semiconductor layer.

In FIG. 6B, bonding layer 104 is formed on first substrate 102. In some implementations, bonding layer 104 may include a conductive material, such as metal or metal alloy. In some implementations, bonding layer 104 may include Au. Sn In Cu or Ti. In some implementations, bonding layer 104 may include a non-conductive material, such as polyimide (PI), polydimethylsiloxane (PDMS). In some implementations, bonding layer 104 may include a photoresist, such as SU-8 photoresist. In some implementations, bonding layer 104 may include hydrogen silsesquioxane (HSQ) or divinylsiloxane-bis-benzocyclobutene (DVS-BCB). In some implementations, a conductive layer 126 may be formed on first doping type semiconductor layer 106. In some implementations, conductive layer 126 may form a common electrode covering first doping type semiconductor layer 106. In some implementations, conductive layer 126 may form an ohmic contact on first doping type semiconductor layer 106. In some implementations, conductive layer 126 and bonding layer 104 may be collectively referred to as one layer in later operations.

Referring to FIG. 6C and operation 702 of FIG. 7, second substrate 124 and the semiconductor layer, including first doping type semiconductor layer 106, second doping type semiconductor layer 108 and MQW layer 110, are flipped over and bonded to first substrate 102 through bonding layer 104 and conductive layer 126. Then, second substrate 124 may be removed from the semiconductor layer. FIG. 6C shows bonding layer 104 between first substrate 102 and first doping type semiconductor layer 106. However, in some implementations, bonding layer 104 may include one or multiple layers to bond first substrate 102 and first doping type semiconductor layer 106. For example, bonding layer 104 may include a single conductive or non-conductive layer. For another example, bonding layer 104 may include an adhesive material and a conductive or non-conductive layer. In some implementations, bonding layer 104 and conductive layer 126 may be collectively referred to as one layer after operation 702. It is understood that the descriptions of the material of bonding layer 104 are merely illustrative and are not limiting, and those skilled in the art can change according to requirements, all of which are within the scope of the present application.

In FIG. 6D, a thinning operation may be performed on second doping type semiconductor layer 108 to remove a portion of second doping type semiconductor layer 108. In some implementations, the thinning operation may include a dry etching or a wet etching operation. In some implementations, the thinning operation may include a chemical-mechanical polishing (CMP) operation. In some implementations, the thickness including first doping type semiconductor layer 106, MQW layer 110 and second doping type semiconductor layer 108 may be between about 0.3 μm and about 5 μm. In some other implementations, the thickness including first doping type semiconductor layer 106, MQW layer 110 and second doping type semiconductor layer 108 may be between about 0.4 μm and about 4 μm. In some alternative implementations, the thickness including first doping type semiconductor layer 106, MQW layer 110 and second doping type semiconductor layer 108 may be between about 0.5 μm and about 3 μm.

Referring to FIG. 6E and operation 704 of FIG. 7, a first etching operation may be performed to remove a portion of second doping type semiconductor layer 108 and expose a portion of first doping type semiconductor layer 106. A portion of first doping type semiconductor layer 106 is exposed until a pre-defined thickness of first doping type semiconductor layer 106 remains on first substrate 102. In some implementations, the remained first doping type semiconductor layer 106 horizontally extends across a plurality of LED units 116 of LED structure 100 (such as the four LED units 116 shown in FIG. 6E). In some implementations, the pre-defined thickness of first doping type semiconductor layer 106 may be between about 0.05 μm and about 1 μm. In some other implementations, the pre-defined thickness of first doping type semiconductor layer 106 may be between about 0.05 μm and about 0.7 μm. In some alternative implementations, the pre-defined thickness of first doping type semiconductor layer 106 may be between about 0.05 μm and about 0.5 μm. After operation 704, second doping type semiconductor layer 108 and MQW layer 110 of each LED unit 116 may be electrically separated, and first doping type semiconductor layer 106 of adjacent LED units 116 (such as LED units 116-1, 116-2, 116-3 and 116-4) may be electrically connected.

In some implementations, during operation 704, the first etching operation may be performed to remove a portion of second doping type semiconductor layer 108 and expose a portion of MQW layer 110. A portion of MQW layer 110 is exposed until a pre-defined thickness of first doping type semiconductor layer 106 and MQW layer 110 remains on first substrate 102. In some implementations, the remained first doping type semiconductor layer 106 and MQW layer 110 horizontally extends across a plurality of LED units 116 of LED structure 100 (such as the four LED units 116 shown in FIG. 6E). In some implementations, the pre-defined thickness of first doping type semiconductor layer 106 and MQW layer 110 may be between about 0.05 μm and about 1 μm. In some other implementations, the pre-defined thickness of first doping type semiconductor layer 106 and MQW layer 110 may be between about 0.05 μm and about 0.7 μm. In some alternative implementations, the pre-defined thickness of first doping type semiconductor layer 106 and MQW layer 110 may be between about 0.05 μm and about 0.5 μm. After operation 704, second doping type semiconductor layer 108 of each LED unit 116 may be electrically separated, and first doping type semiconductor layer 106 and MQW layer 110 of adjacent LED units 116 (such as LED units 116-1, 116-2, 116-3 and 116-4) may be electrically connected.

Referring to FIG. 6F, a second etching operation may be performed to remove a portion of first doping type semiconductor layer 106 and expose contact 118. The second etching operation may be a dry etching or a wet etching operation. In a dry etching operation or a wet etching operation, a hard mask (e.g., a photoresist) may be formed on second doping type semiconductor layer 108 and a portion of first doping type semiconductor layer 106 by photolithography process. Then, the uncovered portion of first doping type semiconductor layer 106 is removed by dry etching plasma or wet etching solution to expose contact 118.

Referring to FIG. 6G and operation 706 of FIG. 7, passivation layer 112 is formed on second doping type semiconductor layer 108, exposed first doping type semiconductor layer 106 and exposed contact 118. In some implementations, passivation layer 112 may include $SiO_2$, $Al_2O_3$, SiN or other suitable materials for isolation and protection. In some implementations, passivation layer 112 may include polyimide, SU-8 photoresist, or other photo-patternable polymer. In operation 708 of FIG. 7, opening 120 and opening 122 are formed, as shown in FIG. 6G. Opening 120 exposes a portion of second doping type semiconductor layer 108 and opening 122 exposes contact 118. In some implementations, operation 708 may be performed by a third etching operation to remove a portion of passivation layer 112 and form opening 120 and opening 122. In some further implementations, provided passivation layer 112 is formed by a photo-sensitive material (e.g., polyimide, SU-8 photoresist, or other photo-patternable polymer), operation 708 may be performed by a photolithography operation to pattern passivation layer 112 and expose opening 120 and opening 122.

Referring to FIG. 6H and operation 710 of FIG. 7, electrode layer 114 is formed on passivation layer 112 covering opening 120 and opening 122. Therefore, electrode layer 114 electrically connects second doping type semiconductor layer 108 and contact 118, and forms an electrical path to connect the LED unit with the driving circuit in substrate 102. The driving circuit may control the voltage and current level of second doping type semiconductor layer 108 through contact 118 and electrode layer 114. In some implementations, electrode layer 114 may include conductive materials, such as indium tin oxide (ITO), Cr, Ti, Pt, Au, Al, Cu, Ge or Ni.

The present disclosure provides a LED structure and a method for manufacture the LED structure in which the functional epitaxy layer, such as first doping type semiconductor layer 106 and second doping type semiconductor layer 108, is partially patterned/etched to allow a thin continuous functional layer (such as first doping type semiconductor layer 106) to remain in order to avoid potential peeling off. Further, the present disclosure provides another option to remain MQW layer on first doping type semiconductor layer 106. In addition, the manufacturing method introduced in the present disclosure can further reduce physical damage of sidewalls of functional mesas (such as LED unit 116), reduce damage of quantum well structure which is the light emitting region of the LED, and improve the optical and electrical properties of functional mesas.

According to one aspect of the present disclosure, a LED structure is disclosed. The LED structure includes a substrate and a plurality of LED units formed on the substrate. Each LED unit includes a bonding layer formed on the substrate, a first doping type semiconductor layer formed on the bonding layer, a second doping type semiconductor layer formed on the first doping type semiconductor layer, a passivation layer formed on the second doping type semiconductor layer and a portion of the first doping type semiconductor layer; and an electrode layer formed on a portion of the passivation layer and contacting the second doping type semiconductor layer. The plurality of LED units include a first LED unit and a second LED unit adjacent to the first LED unit. The first doping type semiconductor layer of the first LED unit horizontally extends to the first doping type semiconductor layer of the second LED unit adjacent to the first LED unit, and the first LED unit and the second LED unit are individually functionable LED units.

In some implementations, the second doping type semiconductor layer of the first LED unit is electrically isolated from the second doping type semiconductor layer of the second LED unit. In some implementations, each LED unit further includes a multiple quantum well (MQW) layer formed between the first doping type semiconductor layer and the second doping type semiconductor layer.

In some implementations, the first doping type semiconductor layer is a p-type semiconductor layer and is a common anode of the first LED unit and the second LED unit. In some implementations, the second doping type semiconductor layer is a n-type semiconductor layer and is a cathode of the first LED unit and the second LED unit.

In some implementations, the substrate includes a driving circuit to drive the plurality of LED units. In some implementations, the electrode layer of each LED unit is connected to the driving circuit through an opening on the first doping type semiconductor layer.

According to another aspect of the present disclosure, a LED structure is disclosed. The LED structure includes a substrate and a plurality of LED units formed on the substrate. Each LED unit includes a p-n diode layer formed on the substrate, a passivation layer formed on the p-n diode layer, and an electrode layer formed on the passivation layer and contacting the p-n diode layer. The plurality of LED units include a first LED unit and a second LED unit adjacent to the first LED unit. The first LED unit and the second LED unit have a common anode, and the first LED unit and the second LED unit are individually functionable LED units.

In some implementations, the p-n diode layer includes a p-doped layer, a n-doped layer, and a multiple quantum well (MQW) layer formed between the p-doped layer and the n-doped layer. In some implementations, the p-doped layer is the common anode of the first LED unit and the second LED unit. In some implementations, the n-doped layer of the first LED unit and the second LED unit is electrically isolated.

In some implementations, each LED unit further includes a bonding layer formed between the substrate and the p-n diode layer. In some implementations, the substrate includes a driving circuit to drive the plurality of LED units. In some implementations, the electrode layer of each LED unit is connected to the driving circuit through an opening on the p-n diode layer.

According to a further aspect of the present disclosure, a method for manufacturing a LED structure is disclosed. A semiconductor layer is formed on a first substrate. The semiconductor layer includes a first doping type semiconductor layer and a second doping type semiconductor layer. A first etching operation is performed to remove a portion of the second doping type semiconductor layer and expose a portion of the first doping type semiconductor layer. A passivation layer is formed on the second doping type semiconductor layer and the exposed first doping type semiconductor layer. A first opening is formed on the passivation layer. An electrode layer is formed on the passivation layer covering the first opening and contacting the second doping type semiconductor layer.

In some implementations, performing the first etching operation further includes removing a portion of the second doping type semiconductor layer, and exposing a portion of the first doping type semiconductor layer until a pre-defined thickness of the first doping type semiconductor layer remains on the first substrate. The remained first doping type semiconductor layer horizontally extends across a plurality of LED units of the LED structure.

In some implementations, forming the semiconductor layer on the first substrate further includes bonding the semiconductor layer onto the first substrate through a bonding layer. In some implementations, forming the semiconductor layer on the first substrate further includes forming a driving circuit in the first substrate, forming the semiconductor layer on a second substrate, bonding the semiconductor layer onto the first substrate through the bonding layer, and removing the second substrate.

In some implementations, forming the first opening on the passivation layer further includes forming a second opening on the passivation layer to expose the contact of the driving circuit. In some implementations, forming the electrode layer on the passivation layer covering the first opening and contacting the second doping type semiconductor layer further includes forming the electrode layer on the passivation layer covering the first opening and the second opening to electrically connect the second doping type semiconductor layer and the contact of the driving circuit.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A light emitting diode (LED) structure, comprising:
a substrate; and
a plurality of LED units formed on the substrate, each LED unit comprising:
a bonding layer formed on the substrate;
a first doping type semiconductor layer formed on the bonding layer;
a second doping type semiconductor layer formed on the first doping type semiconductor layer;
a passivation layer formed on the second doping type semiconductor layer and a portion of the first doping type semiconductor layer; and
an electrode layer formed on a portion of the passivation layer and contacting the second doping type semiconductor layer,
wherein the plurality of LED units comprise a first LED unit and a second LED unit adjacent to the first LED unit, wherein the first doping type semiconductor layer of the first LED unit horizontally extends to the first doping type semiconductor layer of the second LED unit adjacent to the first LED unit, the first LED unit and the second LED unit are individually functionable LED units, and an opening is formed in the first doping type semiconductor layer between the first LED unit and the second LED unit without disconnecting the first doping type semiconductor layer of the first LED unit from the first doping type semiconductor layer of the second LED unit,
wherein the substrate comprises a driving circuit to drive the plurality of LED units, the driving circuit comprises a contact exposed by the opening in the first doping type semiconductor layer between the first LED unit and the second LED unit, and the contact is electrically connected with the second doping type semiconductor layer of the first LED unit through the electrode layer, and
wherein the bonding layer is formed between the substrate and the first doping type semiconductor layer to bond the substrate and the plurality of LED units.

2. The LED structure of claim 1, wherein the second doping type semiconductor layer of the first LED unit is electrically isolated from the second doping type semiconductor layer of the second LED unit.

3. The LED structure of claim 1, wherein each LED unit further comprises a multiple quantum well (MQW) layer formed between the first doping type semiconductor layer and the second doping type semiconductor layer.

4. The LED structure of claim 1, wherein the first doping type semiconductor layer is a p-type semiconductor layer and is a common anode of the first LED unit and the second LED unit.

5. The LED structure of claim 1, wherein the second doping type semiconductor layer is a n-type semiconductor layer and is a cathode of the first LED unit and the second LED unit.

6. The LED structure of claim 1, wherein the electrode layer of each LED unit is connected to the driving circuit through the opening in the first doping type semiconductor layer.

7. A light emitting diode (LED) structure, comprising:
a substrate; and
a plurality of LED units formed on the substrate, each LED unit comprising:
a p-n diode layer formed on the substrate;
a bonding layer formed between the substrate and the p-n diode layer;
a passivation layer formed on the p-n diode layer; and
an electrode layer formed on the passivation layer and contacting the p-n diode layer,
wherein the plurality of LED units comprise a first LED unit and a second LED unit adjacent to the first LED unit, wherein the first LED unit and the second LED unit have a common anode in the p-n diode layer, the first LED unit and the second LED unit are individually functionable LED units, and an opening is formed in the p-n diode layer between the first LED unit and the second LED unit without disconnecting the p-n diode layer of the first LED unit from the the p-n diode layer of the second LED unit,
wherein the substrate comprises a driving circuit to drive the plurality of LED units, the driving circuit comprises a contact exposed by the opening in the p-n diode layer between the first LED unit and the second LED unit, and the contact is electrically connected with the p-n diode layer of the first LED unit through the electrode layer, and
wherein the bonding layer is a layer to bond the substrate and the plurality of LED units.

8. The LED structure of claim 7, wherein the p-n diode layer comprises a p-doped layer, a n-doped layer, and a multiple quantum well (MQW) layer formed between the p-doped layer and the n-doped layer.

9. The LED structure of claim 8, wherein the p-doped layer is the common anode of the first LED unit and the second LED unit.

10. The LED structure of claim 8, wherein the n-doped layer of the first LED unit and the second LED unit is electrically isolated.

11. The LED structure of claim 7, wherein the electrode layer of each LED unit is connected to the driving circuit through the opening in the p-n diode layer.

12. A method for manufacturing a light emitting diode (LED) structure, comprising:
forming a semiconductor layer on a first substrate, the semiconductor layer comprising a first doping type semiconductor layer and a second doping type semiconductor layer;
performing a first etching operation to remove a portion of the second doping type semiconductor layer and expose a portion of the first doping type semiconductor layer;
forming a first opening in the first doping type semiconductor layer between a first LED unit and a second LED unit without disconnecting the first doping type semiconductor layer of the first LED unit from the first doping type semiconductor layer of the second LED unit, the first LED unit and the second LED unit being adjacent LED units in the LED structure;
forming a passivation layer on the second doping type semiconductor layer and the exposed first doping type semiconductor layer, and the passivation layer covers the first opening;
forming a second opening and a third opening on the passivation layer; and
forming an electrode layer on the passivation layer covering the second opening and the third opening and contacting the second doping type semiconductor layer,
wherein forming the semiconductor layer on the first substrate further comprises:
forming a driving circuit in the first substrate;
forming the semiconductor layer on a second substrate;

bonding the semiconductor layer onto the first substrate through a bonding layer; and removing the second substrate.

13. The method of claim 12, wherein performing the first etching operation further comprises:
removing a portion of the second doping type semiconductor layer; and
exposing a portion of the first doping type semiconductor layer until a pre-defined thickness of the first doping type semiconductor layer remains on the first substrate, wherein the remained first doping type semiconductor layer horizontally extends across a plurality of LED units of the LED structure.

14. The method of claim 12, wherein forming the second opening and the third opening on the passivation layer further comprises:
forming the third opening on the passivation layer corresponding to the first opening to expose a contact of the driving circuit.

15. The method of claim 14, wherein forming the electrode layer on the passivation layer covering the second opening and the third opening and contacting the second doping type semiconductor layer further comprises:
forming the electrode layer on the passivation layer covering the second opening and the third opening to electrically connect the second doping type semiconductor layer and the contact of the driving circuit.

* * * * *